United States Patent [19]

Inaba et al.

[11] Patent Number: 4,483,004
[45] Date of Patent: Nov. 13, 1984

[54] LASER FUNCTIONAL DEVICE

[75] Inventors: Humio Inaba; Hiromasa Ito; Yoh Ogawa, all of Sendai, Japan

[73] Assignee: Tohoku University, Sendai, Japan

[21] Appl. No.: 361,816

[22] Filed: Mar. 25, 1982

[30] Foreign Application Priority Data

Sep. 25, 1981 [JP] Japan ............................. 56-150726

[51] Int. Cl.³ .................................... H01S 3/096
[52] U.S. Cl. .................................. 372/8; 357/19; 372/38; 372/44
[58] Field of Search ............... 372/38, 44, 8; 357/19

[56] References Cited

U.S. PATENT DOCUMENTS 4,237,427 12/1980 Holland ............................ 372/38
4,238,707 12/1980 Malissin et al. .................. 372/38
4,292,606 9/1981 Trimmel .......................... 372/38

Primary Examiner—James W. Davie
Attorney, Agent, or Firm—Fleit, Jacobson, Cohn & Price

[57] ABSTRACT

A laser functional device formed by photoelectric direct loop coupling of a laser diode and a photodetector, the latter of which receives a part of an output light of the former together with an external input light and excites the former by an output current thereof, can be easily miniaturized and integrated as a fundamental function active device self-containing a light source and presenting various useful functions of the optoelectronic technology between the external input and the output lights.

7 Claims, 10 Drawing Figures

FIG._1
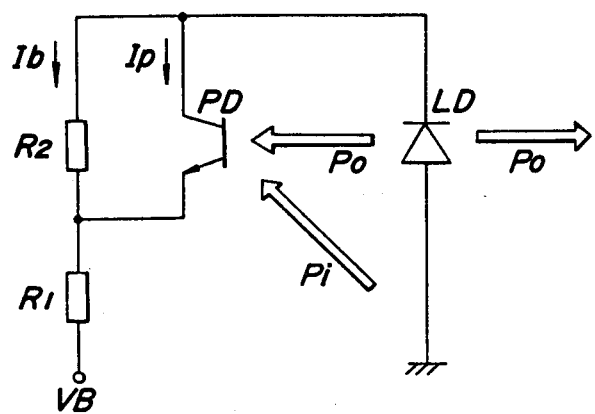
FIG._3a
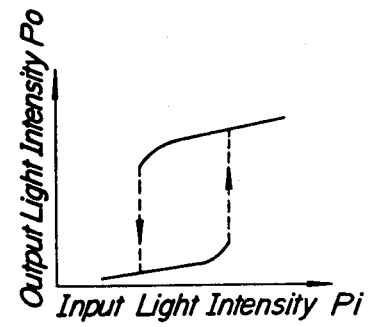
FIG._3b
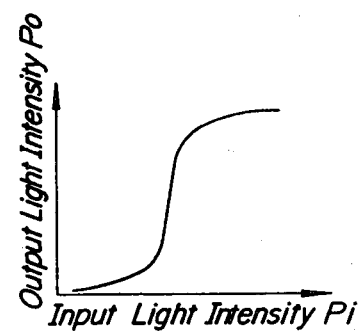

FIG_2e
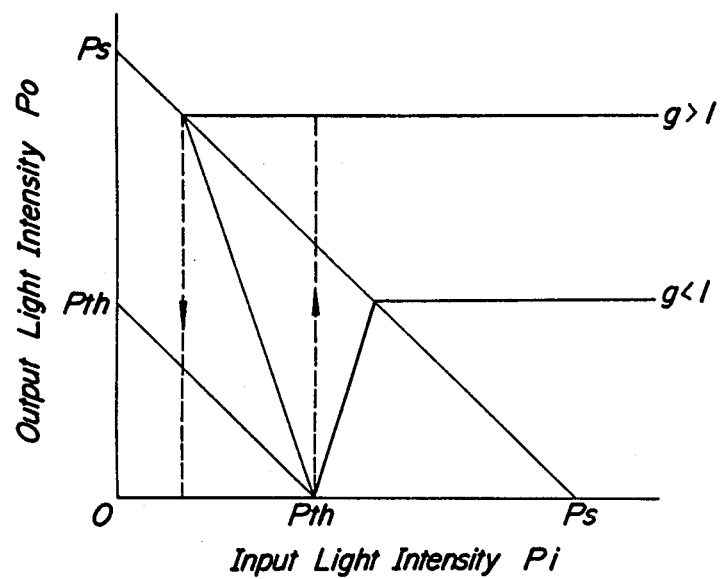

LASER FUNCTIONAL DEVICE

BACKGROUND OF THE INVENTION (1) Field of the Invention

The present invention relates to a laser functional device provided with a laser luminescent element and presenting various functions between an input light and an output light, and particularly formed such as a optoelectronically fundamental function device which is easily miniaturized and integrated.

(2) Description of the Prior Art

Various kinds of conventional devices utilizing an electro-optical effect have been developed for high speed optical data processing and for optical communication.

However, most of these conventional laser functional devices are formed such as a light passing therethrough is controlled by an electro-optical effect element applied with a voltage representing information, so that these conventional devices cannot be regarded as a genuine optical active device such as a desired amount of self-generated output light can be obtained in response to an input light, that is, a so-called light input to light output device.

On the other hand, one of devices of this kind which have been vigorously developed in the last few years is an active bistable optical device, namely, so-called BOD. This device BOD is a genuine light input to light output device of the feedback type in which an optical function element is excited by feeding back a voltage produced in proportion to an intensity of an output light thereof, and further a hysteresis characteristic is presented between output and input lights of this device BOD. Accordingly, this device BOD has an inherent potential for optical switching, optical memory, binary logic, differential amplification, optical transistor, discrimination, clipping, limiting, pulse shaping and the like and further for performing a number of optical digital data processing functions. For instance, a Fabry-Perot resonator having an intrinsic nonlinear medium and an optical modulator having a hybrid configuration imposed with an electrical feedback control have been developed for this device BOD.

However, this conventional optical bistable device is also no more than a passive optical device containing no light source therein. Because the light source is indispensable for proper operation, it is inevitably required that the BOD device to be combined with a separately provided light source. Consequently, these conventional BOD devices cannot function as key elements for the optical system in the integrated structures.

SUMMARY OF THE INVENTION

An object of the present invention is to remove conventional defects of a laser functional device as mentioned above.

Another object of the present invention is to provide a laser functional device which involves a light source, being indispensable for an optical function device, and hence can be operated as a genuine optical device which is capable of presenting various functions between input and output lights thereof as well as being easily integrated.

The present invention is conceived with the attention on a junction type semiconductor laser element which is extremely minuscule and an operation of which can be easily controlled by an injection current. A laser functional device according to the present invention is realized as an optical function active device which presents the same various functions between input and output lights as presented by the aforesaid conventional optical function passive devices that have been vigorously developed and extensively utilized.

The laser functional device according to the present invention, in which a function of optical bistability showing a bistable state of the output light in response to an intensity of the input light in a certain range in a situation where a semiconductor laser element and a photodetector are electrically interconnected in series as well as a part of an output light of the laser element is injected into the photodetector together with an external input light, is featured in that the laser element and the photodetector are optically and electrically interconnected in a loop, the output light of the laser element is varied for providing desired functions under the control of an electrical output of the photodetector which is generated therein in response to the injection thereinto of the output light of the laser element and the input light.

The optical function device presenting the function of optical bistability corresponds to an electrical function device utilizing a bistability obtained between input and an output voltages or currents thereof as essential circuit element being indispensable for an electronic digital circuit, an electronic pulse circuit and the like, and hence can be regarded as one of the most essential optical devices of the optoelectronic technology. Accordingly, it is possible according to the present invention to realize an extremely minuscule genuine optical function device, all of constituents of which is unified by integrating electronical elements including the photodetector.

BRIEF DESCRIPTION OF THE DRAWINGS

For the better understanding of the invention, reference is made to the accompanying drawings, in which:

FIG. 1 is a circuit diagram showing a basic configuration of a laser functional device according to the present invention;

FIGS. 2(a) to 2(e) are characteristic diagrams showing successively examples of operational situations of the laser functional device according to the present invention;

FIGS. 3(a) and 3(b) are characteristic diagrams showing examples of experimental results regarding the laser functional device according to the present invention respectively.

DESCRIPTION OF THE PREFERRED EMBODIMENTS

Figure 2B:
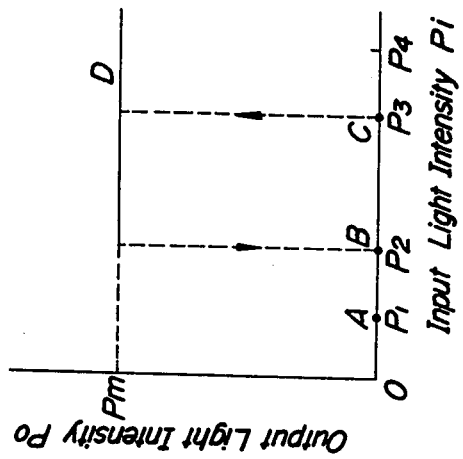

Firstly, an example of a basic configuration of a laser functional device according to the present invention is shown in FIG. 1. In this exemplified configuration, LD and PD denote a semiconductor laser diode and a photodetector respectively, $P_o$ being an output light radiated by the former, $P_i$ being an external input light injected from the outside of the device. Accordingly, in this configuration, the output light $P_o$ of the semiconductor laser diode LD is positively fed back thereto through a photoelectric conversion effected by the photodetector PD. In addition, $R_1$ and $R_2$ represent a resistor network for setting up bias voltages, a feedback rate and the like for both of those elements LD and PD, and a wideband amplifier is included in the photodetector PD as occasion demands. Further, the external input light $P_i$ can be either a coherent light radiated from a laser oscillator or an incoherent light radiated from an ordinary light source. The operational principle of the aforesaid optical bistability effected by this laser functional device consisting of the photoelectrical loop connection between the semiconductor laser diode LD and the photodetector PD is well understood by taking into account the threshold characteristic of the laser diode LD and the saturation behavior of the photodetector PD, which give a nonlinear performance to the input and output lights versus electric current characteristic of this device and hence realize a hysteresis effect based on the co-operation of the laser diode LD and the photodetector PD between the input light $P_i$ and the output light $P_o$. In addition, in a situation where various operating points are set up according to the combination of parameters of the feedback control effected by the above mentioned photoelectric loop connection, various operational modes other than the aforesaid hysteresis effect, for instance, an optical limitation, an optical differential gain and the like can be realized, which present various functions similar to those of the conventional electronic circuits as mentioned above.

Furthermore, sizes of the laser diode LD and the photodetector PD are extremely minuscule such as hundreds $\mu$m in length and several to scores $\mu$m in width, and hence are suitable for integrating monolithic or hybrid optical function devices, so that it is possible to unify the whole configuration including the above mentioned essential elements LD, PD and other electric circuit elements attached thereto on a unitary base. Moreover, it is possible also to give further various functions between the input and the output lights by arraying and multiplexing those units of various kinds. Consequently, it is possible to realize various kinds of advanced fascinating optical systems with various topological structures by employing the laser functional device according to the present invention as a compact and self-containing optoelectrical basic device.

The operation of the laser functional device provided with an extremely excellent expectant performance as mentioned above will be described further in detail.

The operational principle of the above device is based on the threshold characteristic of the laser diode LD and the saturation behavior of the photodetector PD as mentioned earlier, so that, at the beginning of the detailed description, a current input versus light output characteristic of the laser diode LD is ideally expressed by the following equation (1).

$$P_o = 0 \qquad (I_p + I_b < I_{th}) \\ = a(I_p + I_b - I_{th}) \quad (I_{th} < I_p + I_b) \tag{1}$$

where $I_p$ denotes a photocurrent of the photodetector PD, and $I_b$ denotes a d.c. bias current and "a" denotes a current to light conversion coefficient, of the laser diode LD respectively, and further $I_{th}$ denotes a threshold current of the laser oscillation effected by the laser diode LD.

On the other hand, an input light versus output current characteristic of the photodetector PD is approximately expressed by the following equation (2).

$$I_p = k(P_i + P_o) \quad (P_i + P_o < P_s) \\ = kP_s \qquad (P_s < P_i + P_o) \tag{2}$$

where $P_s$ denotes a saturation current and "k" denotes a light to current conversion coefficient, of the photodetector PD respectively.

According to those equations (1) and (2), an input light versus output light characteristic of the laser functional device composed as shown in FIG. 1 can be expressed by the following equation (3).

$$P_o = 0 \qquad (P_i + P_o < P_{th}) \\ = G(P_i - P_{th}) \quad (P_{th} < P_i + P_o < P_s) \\ = g(P_s - P_{th}) \quad (P_s < P_i + P_o) \tag{3}$$

where
g=ak
G=g/(1-g)
$P_{th}=(I_{th}-I_b)/k$

The graphical solution of these equations (1), (2) and (3) can be obtained as follows.

Figure 2A:
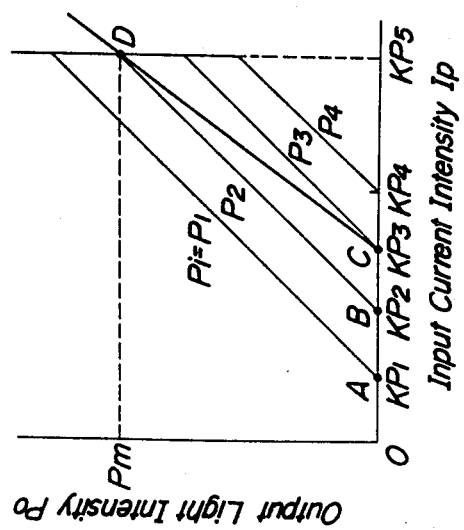

Firstly, the graphical solution of the equations (1) and (2) can be given as shown in FIG. 2(a), in which a thick solid line is a plot of the equation (1), whereas thin solid lines are plots of the equation (2) where intensities of the input light $P_i$ are taken as parameters. Accordingly, an input versus an output light intensities characteristic of the laser functional device according to the present invention can be deduced from the intersection of these plots of two kinds. That is, when the input light intensity $P_i$ is equal to zero, the point of the intersection of these plots, namely, the operating point of the device is positioned at the origin of coordinate axes and then is moved successively to points A, B and C on the abscissa as the input light intensity $P_i$ is increased from $P_1$ to $P_3$. As the input light intensity $P_i$ is further increased, the operating point of the device jumps discontinuously to a point D, and stays at this point D corresponding to the maximum output light intensity $P_m$ against the further increase of the input light intensity $P_i$ as shown in FIG. 2(b).

Thereafter, as the input light intensity $P_i$ is decreased to $P_2$, the operating point of the device still stays at the point D. However, when the input light intensity $P_i$ reaches to $P_2$, the operating point of the device drops discontinuously from the point D to the point B on the abscissa corresponding to the null output light intensity $P_o$, and then returns to the origin as the input light intensity $P_i$ is further decreased as shown in FIG. 2(b). As a result, the operating point of the device presents the hysteresis effect between the input light intensity $P_i$ and the output light intensity $P_o$.

Figure 2D:
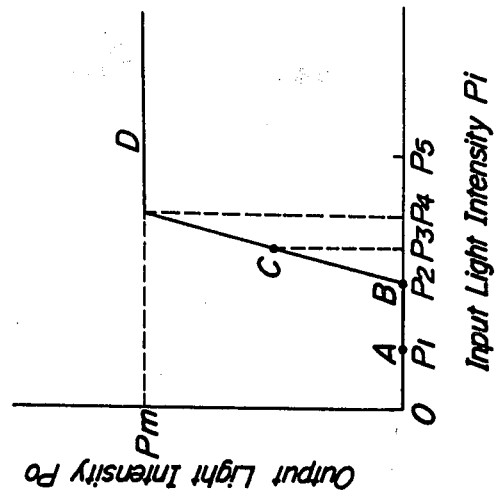
Figure 2C:
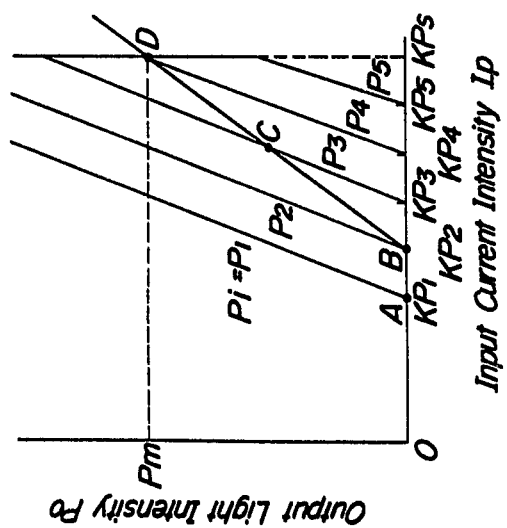

On the other hand, it is also known from the similar consideration as mentioned above the aforesaid differential gain characteristic can be attained by properly decreasing at least either one of the light to current conversion coefficient "k" of the photodetector PD and the current to light conversion coefficient "a" of the laser diode LD, as shown graphically in FIGS. 2(c) and 2(d).

The operational behavior as mentioned above by referring to FIGS. 2(a) to 2(d) can be summarized as expressed by the equation (3) as well as can be graphically exhibited as shown in FIG. 2(e). Consequently, with respect to the product "g" of the respective conversion coefficients "a" and "k" of the laser diode LD and the photodetector PD, that is, g=ak, when $\frac{1}{2}<g<1$, the relation $G(=dP_o/dP_i)>1$ can be obtained, and hence the aforesaid differential gain can be achieved, whilst, when g>1, the value G becomes less than zero, and hence the aforesaid hysteresis effect can be achieved.

Next, as a result of an experiment based on the above investigation of the operational behavior of the laser functional device consisting of an AlGaAs semiconductor laser diode as the element LD and a Si phototransistor as the element PD together with a light emitting diode (LED) or another laser diode as an external input light source for controlling the device, all of which are commercially available, typical input light versus output light characteristic curves are shown in FIG. 3(a) and 3(b) respectively. FIG. 3(a) shows an example of the hysteresis characteristic curve obtained by sinusoidally modulating the external input light intensity derived from the light emitting diode LED. Regarding this operational mode, it should be noted that the laser diode effects the oscillation only in the "on" state thereof and does not effect the oscillation in the "off" state, and, as a result, the aforesaid bistability can be attained in the spectral region. On the other hand, FIG. 3(b) shows an example of the differential gain characteristic curve of the same, which is obtained by appropriately adjusting the feedback rate, for instance, according to the control of the source voltage $V_B$ and the bias resistor $R_1$ in the configuration thereof as shown in FIG. 1. First time response can be expected by utilizing a faster photodetector such as an avalanche photodiode.

In addition, the laser functional device can be operated as a memory device by utilizing the bistability as shown in FIG. 3(a), as well as can be operated as an optical amplifier, an optical pulse shaping device, an optical pulse height comparator or discriminator, an optical limiter, an optical repeater and the like by utilizing the differential gain performance as shown in FIG. 3(b).

As mentioned above, the laser functional device according to the present invention, which self-contains a light source being indispensable for the optical function device and attains various functions with an extremely simple configuration, is featured by the photoelectric loop connection for effecting the feedback control such as respective variations of the photocurrent of the photodetector, the exciting current of the laser diode, the output light and again the aforesaid photocurrent are performed successively in circulation under the basic configuration as shown in FIG. 1. However this basic configuration of the device can be variously modified. In addition thereto, the semiconductor laser diode LD consisting in this basic configuration can be substituted by various kinds of laser emitting elements such as gas, solid and liquid, for instance, dye lasers, whereas various kinds of photodiodes, phototransistors avalanche photodiodes and the like can be employed for the photodetector PD.

Figure 4A:
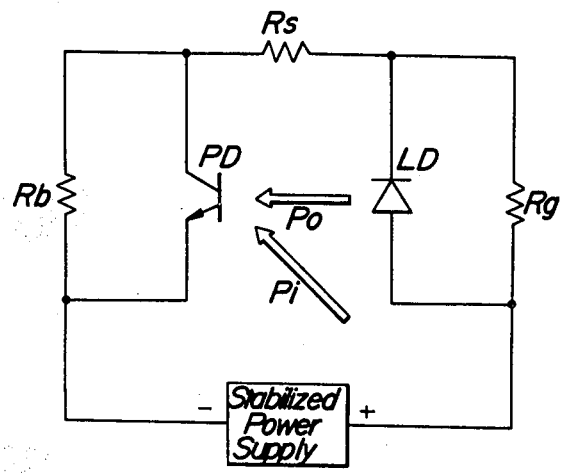
FIGS. 4(a) and 4(b) are circuit diagrams showing other examples of configurations of the laser functional device according to the present invention respectively.

One of the most simple modifications of the device is shown in FIG. 4(a). In this modification, a resistor $R_b$, which is desirably made adjustable, is used mainly for setting up the bias current of the laser diode LD, and a resistor $R_g$ is used for branching and setting up the feedback controlling current of the laser diode LD, and further a resistor $R_s$ is used for protecting the laser diode LD and, as a result, affects the response time of the device. The source voltage $V_B$ in this modification is supplied by a stabilized power supply SPS for stabilizing the operation of the whole device.

Figure 4B:
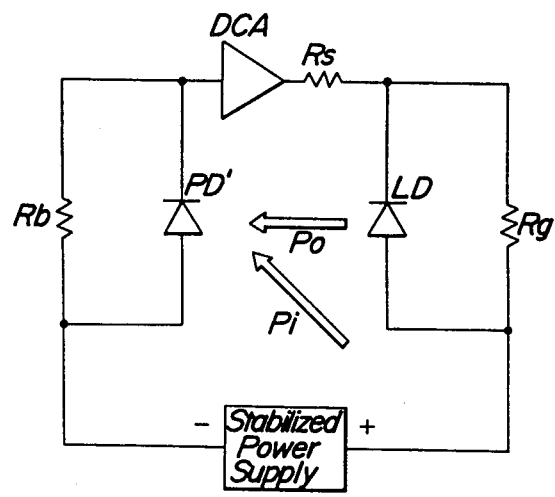

In a situation where the rate of the feedback control effected by the photodetector PD is insufficient in the modification as shown in FIG. 4(a), a d.c. amplifier DCA is inserted in the feedback loop as shown in FIG. 4(b), so as to attain a required rate of the feedback control.

As is apparent from the above description, according to the present invention, the bistability of the optical function active device can be achieved under the control of the external input light in the basic configuration consisting of the photoelectric loop connection between the laser emitting element, for instance, the semiconductor laser diode, and the photoelectric converting element, for instance, the photodetector, in which the light source being indispensable for the optical function device is self-contained, so that the laser functional device according to the present invention does not necessitate at all any accompanied external light source as quite different from the conventional BOD device. Accordingly, the miniaturization, the integration, the low power consumption and the economization of the optical function device can be promoted much more vigorously.

Moreover, because of the extremely simple basic configuration of the device, various kinds of optical function devices can be realized by the modification of the basic configuration. For example, the insertion of a wideband amplifier into the feedback loop, the delayed control effected by a delay, the combination of integrated units, the various modes of interconnections between the laser diodes and the photodetectors of the combined units and the like can be conceived for realizing various kinds of new useful functions of the optoelectric device, so as to develop an optical multivibrator, an optical digital memory, an optical computer element, an optical pulse shaper, an optical amplifier, an optical discriminator, an optical limiter, an optical digital repeater and the like.

The above advantages obtained by the present invention can be summarized as follows.

(1) Monolithic integration can be readily performed with the present state of the art of fabrication technology, because it consists only of a laser diode and a photodetector in principle.

(2) The integrated device can be minuscule in size, say a few hundreds μm in length, in comparison with conventional devices which is necessitated usually to be about one centimeter long and hence to impose fundamental limitations on the response speeds.

(3) The conditions for the external input light are not severe and are restricted only by the performance of the photodetector, so that the device of the invention can be operated at a low optical power level over a very wide range of light wavelength, and further with an incoherent light.

(4) The above features of the device of the invention can accomplish a new function for incoherent to coherent light conversion with a substantial differential gain.

What is claimed is:

1. An optoelectronic laser device for carrying out a desired function, said device comprising:
   a laser emitting element for emitting a coherent light in response to an exciting electric current that is in excess of the threshold current of the laser emitting element, and a photoelectric converting element for converting at least a part of said coherent light emitted by said laser emitting element to an electric current;

means for optically and electrically connecting said laser emitting element and said photoelectric converting element in a photoelectric loop for accomplishing positive feedback excitation between said laser emitting element and said photoelectric converting element under which said electric current is added in phase to said exciting electric current to the point of saturation of said photoelectric converting element, said light-emitting element providing a light output operative in accordance with a desired function.

2. The optoelectronic device of claim 1, wherein operation parameters of said laser emitting element and said photoelectric converting element are respectively set up in response to said desired function.

3. The optoelectronic device of claim 1, wherein said laser emitting element is controlled by an external light which is incident upon said photoelectric converting element together with said at least a part of said coherent light through said photoelectric converting element.

4. The optoelectronic device of claim 1, wherein said laser emitting element is excited by said electric current derived from said photoelectric converting element through an amplifying element.

5. The optoelectronic device of claim 3, wherein said laser emitting element is excited by said electric current derived from said photoelectric converting element through an amplifying element.

6. The optoelectronic device of claim 1, wherein at least one of at least a hysteresis performance and a differential gain performance is presented as said desired function on the basis of a bistability caused in said photoelectric loop between said laser emitting element and said photoelectric converting element.

7. The optoelectronic device of claim 3, wherein at least one of a hysteresis performance and a differential gain performance is presented as said desired function on the basis of a bistability caused in said photoelectric loop between said laser emitting element and said photoelectric converting element.

* * * * *